United States Patent
Paxman et al.

(10) Patent No.: US 6,362,709 B1
(45) Date of Patent: Mar. 26, 2002

(54) BROADBAND TAP FOR EXTRACTING ENERGY FROM TRANSMISSION LINES USING IMPEDANCE TRANSFORMERS

(75) Inventors: Wesley R. Paxman, Richardson; Samuel M. Warren; Kenneth G. Hodson, both of Plano, all of TX (US)

(73) Assignee: Andrew Corporation, Orland Park, IL (US)

(*) Notice: Subject to any disclaimer, the term of this patent is extended or adjusted under 35 U.S.C. 154(b) by 0 days.

(21) Appl. No.: 09/469,113

(22) Filed: Dec. 21, 1999

(51) Int. Cl.$^7$ .................................................. H01P 5/00
(52) U.S. Cl. ........................ 333/245; 333/125; 439/394; 324/72.5
(58) Field of Search ................................ 439/578, 394; 324/72.5, 690; 333/245, 125

(56) References Cited

U.S. PATENT DOCUMENTS

| | | | |
|---|---|---|---|
| 2,694,182 A | * 11/1954 | Edlen et al. | 333/136 |
| 2,805,399 A | 9/1957 | Leeper | 333/136 |
| 2,891,222 A | 6/1959 | Freen | 333/124 |
| 3,662,294 A | 5/1972 | Jacobs et al. | 333/33 |
| 4,083,902 A | * 4/1978 | Clyde | 264/420 |
| 4,335,364 A | 6/1982 | Schmitz et al. | 333/33 |
| 4,394,617 A | * 7/1983 | Wampler | 324/653 |
| 4,418,314 A | * 11/1983 | Nieto, Jr. | 324/72.5 |
| 4,588,249 A | * 5/1986 | Bichasz et al. | 439/394 |
| 4,746,307 A | * 5/1988 | Joly et al. | 439/394 |
| 4,951,012 A | 8/1990 | Oppelt et al. | 333/33 |
| 5,160,465 A | * 11/1992 | Soderberg | 264/46.5 |
| 5,171,162 A | * 12/1992 | Kaufman | 439/394 |
| 5,281,933 A | 1/1994 | Chamberlin | 333/132 |
| 5,343,184 A | * 8/1994 | Matsui et al. | 336/92 |
| 5,384,558 A | 1/1995 | Maruhashi | 333/33 |
| 5,432,457 A | * 7/1995 | Mitzner et al. | 324/690 |
| 5,486,803 A | * 1/1996 | Igarashi et al. | 336/92 |
| 5,689,218 A | 11/1997 | Stein et al. | 333/125 |
| 5,729,184 A | 3/1998 | Paxman et al. | 333/125 |
| 5,900,796 A | * 5/1999 | Parker | 336/92 |

OTHER PUBLICATIONS

"Mixers in Microwave systems," Bert Henderson, Microwave Systems News, Oct. 1989, pp. 4, 64–65, 68–69 and 72–74.

"Mixers in Microwave Systems—Part II," Bert Henderson, Microwave Systems News, Nov. 1989, pp. 4, and 71–75.

"Design of Broadband Passive Components with Ferrites," M. MacDonald, Microwaves & RF, Oct. 1993, pp. 4 pages 81–84 ?

"Some Broad–Band Transformers," C.L. Ruthroff, Proceedings of the IRE vol. 47, Aug. 1959, pp. 1337–1342.

Chapter 5 of the Book by E.C. Sneling and A.D. Giles *Ferrites for Inductors and Transformers*, Research Studies Press, 1983, pp. 103–153.

G. Guanella, "New Method of Impedance Matching in Radio–Frequency Circuits," *The Brown Boveri Review*, vol. 31, Sep. 1944, pp. 327–329.

Ersch Rotholz, "Transmission–Line Trandformers, IEEE Transactions on Microwave Theory and Techniques," vol. MTT029, No. 4, Apr. 1981, pp. 327–331.

Alex J. Burwasser, "Taking the Magic Out of the 'Magic Tree'," RF Design, May/Jun. 1983, pp. 44–60.

* cited by examiner

Primary Examiner—Justin P. Bettendorf
Assistant Examiner—Deon Takaoka
(74) Attorney, Agent, or Firm—Stephen G. Rudisill; Jenkens & Gilchrist

(57) ABSTRACT

A tap for coupling electromagnetic energy between first and second coaxial cables includes an impedance transformer, a probe for connecting the impedance transformer to the first cable, and a tap cable for connecting the impedance transformer to the second cable. Ferrite beads surround the probe and the tap cable to provide frequency-variable series impedances.

26 Claims, 3 Drawing Sheets

BROADBAND TAP FOR EXTRACTING ENERGY FROM TRANSMISSION LINES USING IMPEDANCE TRANSFORMERS

BACKGROUND OF THE INVENTION

The present invention relates generally to taps which extract electromagnetic energy from transmission lines and specifically taps which extract electromagnetic energy from transmission lines and which couple the electromagnetic energy to other transmission lines.

This application concerns the invention of a tap designed to be mounted on a to coaxial Radio Frequency (RF) communications feeder cable. The tap presents minimal degradation to the cable's performance, while maintaining uniform coupling over a multi-octave bandwidth. The tap does not require a splice.

Our following prior U.S. patents disclose taps of this general type:

"A Tap For Extracting Energy From Transmission Lines Using Impedance Transformers," U.S. Pat. No. 5,729,184, by inventors W. Paxman and R. Stein; and "A Tap For Extracting Energy From Transmission Lines," U.S. Pat. No. 5,689,218, by inventors R. Stein and W. Paxman.

Most taps currently on the market are relatively narrow band or have high-insertion-loss sections (thru) between the wide band limits. Another problem with most taps on the market today is the potential of damaging the tap during installation. One particular difficulty is the connection of a feeder or jumper cable to the tap after it is installed. Tightening the connector places stress on the tap and its mounting, damaging it.

The previous inventions by R. Stein and W. Paxman (cited above) describe taps for coaxial transmission lines using cross-connected couplers and impedance transformers with matching resistors, respectively. The current invention is based on the impedance transformer principle of the prior art, with dramatic performance and cost improvements.

SUMMARY OF THE INVENTION

It is an object of the invention to provide a method of transforming the load impedance of a tap such that the tap engenders low losses in the host cable and operates over an increased coupling bandwidth.

Another object of the invention is to provide an assembly for the tap that is simple, inexpensive to manufacture and use, and rugged in operation, and does not require separate installation of a feeder or jumper cable.

Other aspects and advantages of the present invention will become apparent upon reading the following detailed description and upon reference to the drawings.

In accordance with the present invention, the foregoing objectives are realized by a tap for coupling electromagnetic energy between a host cable and a second coaxial cable. The tap comprises an impedance transformer, a probe for connecting the impedance transformer to the host cable, a tap cable for connecting the impedance transformer to the second cable, and means defining an inductance coupled in series between the probe and the impedance transformer. A

DETAILED DESCRIPTION OF THE ILLUSTRATED EMBODIMENT

Figure 1:
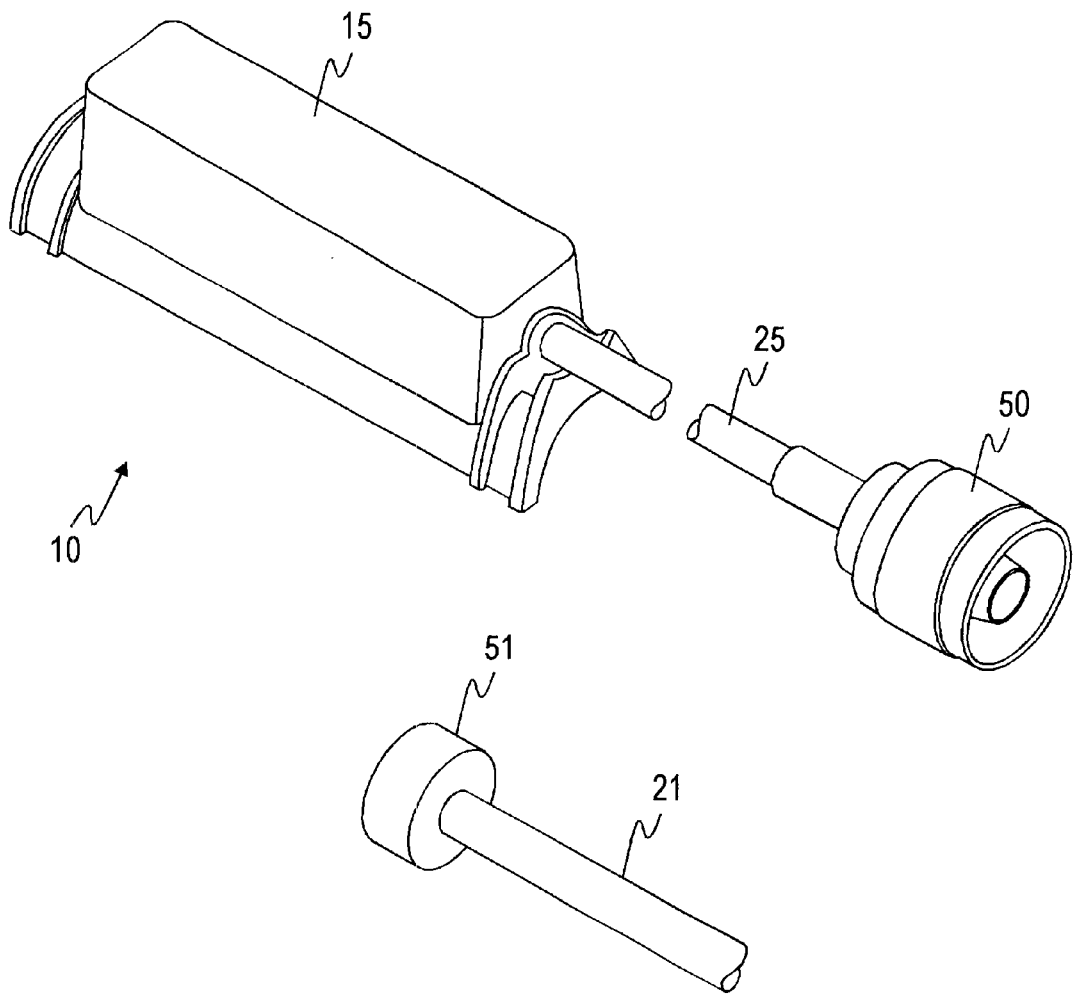
FIG. 1 is a perspective view of a tap according to the principles of the invention.
Figure 1A:
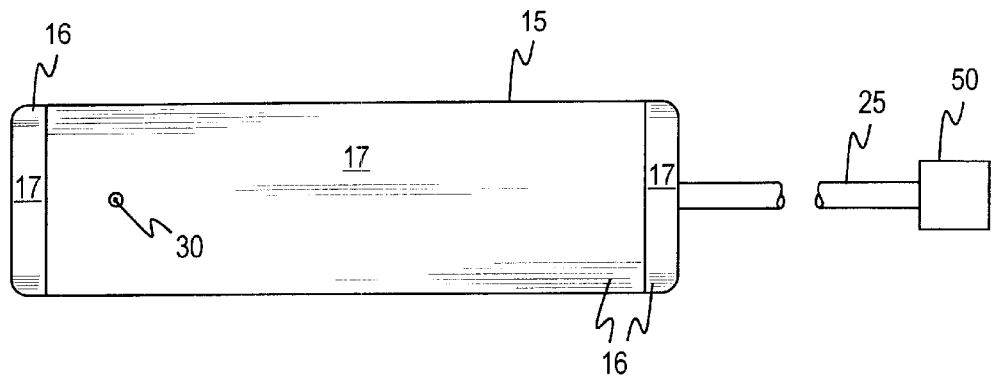
FIG. 1a is a bottom plan view of the tap of FIG. 1.

Referring to FIG. 1, the new and improved tap is simple to manufacture and easy to install, and, as a consequence, low in cost. Most existing taps use drilled and tapped housings. The new tap 10 uses a low-cost molded and ultrasonically welded housing 15, giving it great flexibility in pricing. As indicated in FIG. 1a, the underside of the housing 15 has a semi-cylindrical surface 16, which may be sized to fit around a cable of desired size. The surface 16 is covered with a thin layer of an adhesive-surfaced foam material ("adhesive foam") so as to adhere to, and seal or insulate, about the external surface of a host cable. A protective peal-off backing (not shown) may be applied to the surface of the adhesive foam 17.

The new tap provides a flexible cable 25 (the "tap cable") at the output to serve as a jumper, which reduces the mechanical stresses on the tap body. The cable 25 terminates in a coaxial connector 50.

Taps have a cost savings over couplers due to fewer jumper cables. The jumper 25 on our new tap 10 also eliminates the need for the customer to buy and install a separate jumper cable. In addition to the cost savings due to elimination of the usual jumper, the installation is faster. It involves placing a special drill in a drill motor, drilling a hole in the cable, cleaning the cable, pealing off an adhesive foam layer's protective backing, aligning the tap guide with the hole, and pressing. Cable ties (not shown) may be added for greater security, if desired. The basic operation can be done with one hand, enabling ease of installation in difficult areas.

Figure 2:
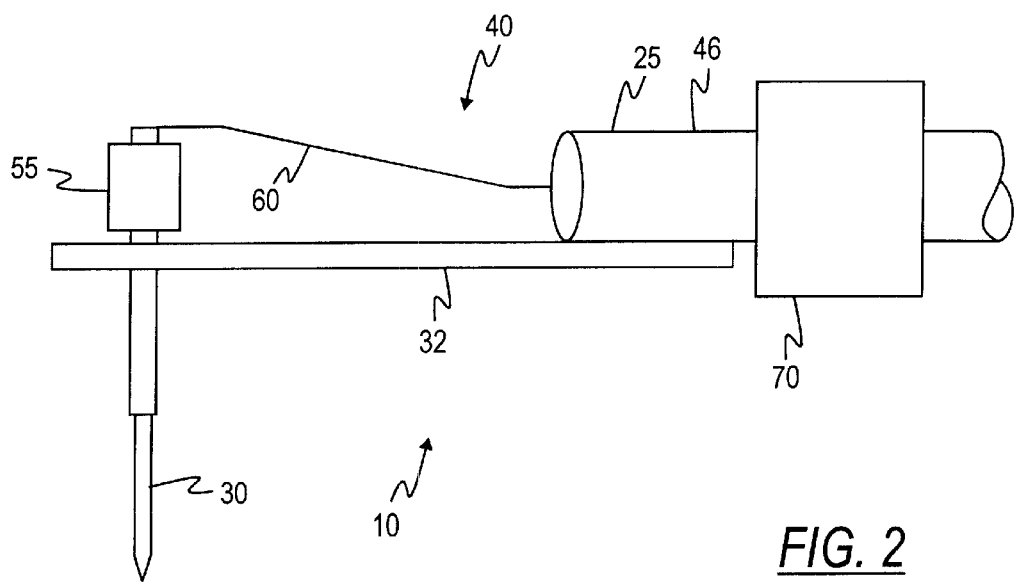
FIG. 2 is a somewhat simplified partial side elevation of the tap of FIG. 1, with an external housing removed.
Figure 3:
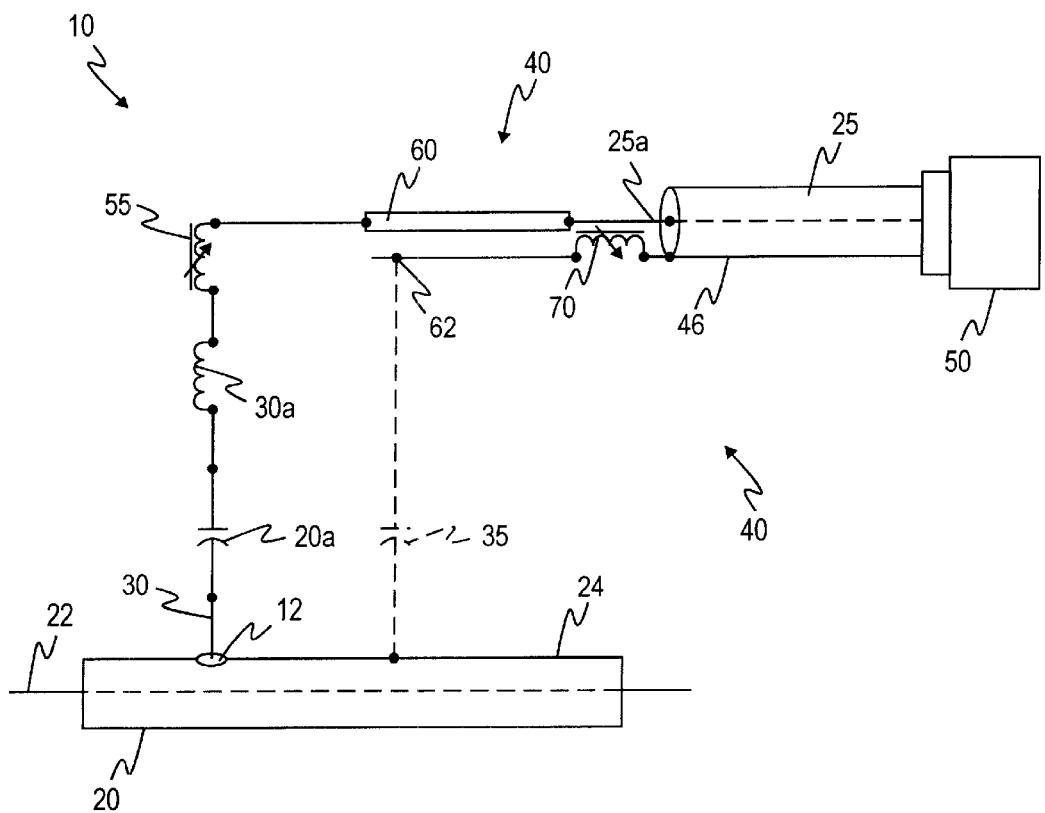
FIG. 3 is a schematic diagram of a first order equivalent circuit of a tap according to the principles of the invention.

FIGS. 1–3 show a tap 10 for coupling electromagnetic energy between coaxial cable transmission lines. FIG. 3 shows the equivalent circuit. Although coaxial transmission lines are shown, it will be understood that any kind of transmission lines can be tapped by the invention. As indicated in FIG. 3, a hole 12 is drilled through the outer jacket, outer conductor, and dielectric of a first or host coaxial feeder cable 20 to a central conductor 22. The hole 12 is drilled such that the central conductor 22. Penetration into the central conductor 22 when the hole 12 is drilled is preferably minimal.

For the purpose of extracting electromagnetic energy from the central conductor 22 and conducting this energy into the tap 10, a probe 30 is placed in the hole 12. The probe 30 is spring-loaded to bias the probe into engagement with the central conductor 22. The host cable can be any form of coaxial cable such as radiating or non-radiating coaxial cable. As indicated above, a layer of insulating adhesive foam 17 is added to seal the tap to the cable.

In order to couple the extracted energy to the output of the tap, an impedance transformer 40 is attached between the probe 30 and the tap cable 25 which terminates in the output RF connector 50. The illustrated embodiment, the impedance transformer 40 includes a quasi- transmission line 60. The impedance transformer 40 operates with a center frequency which is a function of the length of the transmission line 60. One end of the transmission line 60 is coupled in series with the probe 30. The inductance of the probe 30 is represented in FIG. 3 as a series inductance 30a, while the ground-to-shield capacitance of the cable 20 is represented as a series capacitance 20a. A frequency-variable series impedance 55, which will be described later, is also provided.

For the purpose of attaching the tap to another cable and completing the coupling of the extracted energy from the host cable 20 to a second cable 21 having a mating connector 51 (see FIG. 1), the tap cable 25 is connected to the impedance transformer 40 by attaching the other end of transmission line 60 to the inner conductor 25a of cable 25.

The tap described in FIG. 3 will extract from more than 25 percent to less than 1 percent of the energy from a host coaxial cable 12 while adding a minimum line loss to the host. This tap can be configured to operate at frequencies exceeding 4 GHz while maintaining a usable band width of +/−50 percent of the center frequency. The microstrip transmission line of FIG. 1a represents one possible configuration of an impedance transformer.

In one embodiment, a microstrip transmission line on a substrate may be employed as the transmission line 60. In another embodiment, the transmission line 60 may be a single conductor above a ground plane. However, any form of impedance transformer, including Ruthroff transformers, Guanella transformers, stripline transmission lines, microstrip transmission lines, lumped element equivalent transmission lines, or multiple transmission lines, could be used. In addition, the match at the second coaxial cable could be improved by resistive or other matching means, and the selectivity at the input could be enhanced by proper selection of the capacitor.

The construction of the tap is similar in some respects to that of the inventions described in our above-referenced prior patents, with a spring loaded probe 30 connected to a transmission line (impedance transformer) 60, which is, in turn, connected to the output port. The output port consists of a length of coaxial cable, the tap cable 25, terminated in the connector 50. The spring loaded probe 30 is inserted into the host cable through a hole drilled through the jacket, shield, and dielectric of the host cable, as described above. The probe has a sharp point capable of penetrating any non-metallic residue on the surface of the center conductor.

A first improvement to the known impedance transformers is the increased coupling bandwidth, accomplished while minimizing the thru line losses in the band. A second improvement is the ability to install the tap with one hand. A third improvement is the addition of a short length of very flexible cable to the output of the tap, reducing the user cost and stresses to the tap attachment to the host cable.

The first above-noted improvement is accomplished by means of three factors. The first factor unique to this invention is the use of a small (annular) ferrite bead 55 (see FIG. 2) surrounding the end of the probe 30 adjacent the transmission line 60. This ferrite bead 55 provides a series impedance which is frequency variable at lower MHz frequencies (from around 100–400 MHz, depending on the ferrite element selected) a series inductance is provided, while at the higher MHz frequencies (in the GHz range) the bead is almost entirely resistive, having little inductive effect. This "frequency variable impedance" significantly improves the flatness of the signal transmission through the tap. This element 55 is indicated in the equivalent circuit of FIG. 3 as a variable inductor.

The second factor unique to this invention is the elimination of a direct connection from the tap ground 62 to the shield 24 of the host cable while retaining coupling down to low frequencies. In this regard, FIG. 2 is a simplified side elevation of a physical embodiment of the invention, showing the above-described components mounted to a circuit board 32. This invention allows sizing and positioning of the circuit board 32 (see FIG. 2) so as to use the equivalent board capacitance 35 (shown in phantom line in FIG. 3) to "tune" the response and provide additional flatness while expanding the frequency response. As a result, even frequencies of 400 MHz or lower can be tapped without a direct connection, something not possible in the prior art.

The third factor unique to this invention is the use of a large (annular) ferrite bead 70 (or the equivalent) around the shield 46 of the tap cable 25 (see FIG. 2) so as to adapt the "balanced" tap to the "unbalanced" system used in most instances, thus reducing the sensitivity of the tap cable 25 to changes in its environment and termination. The large ferrite bead 70 provides a frequency-variable impedance in much the same way as described above for the small ferrite bead 55, and is indicated in FIG. 3 in series with the ground connection to the shield of the tap cable 25.

The transmission line 40 shown in FIG. 2 is, in effect, a single conductor 60 above a ground plane. This could also be a microstrip line on the surface of the circuit board 32. In the microstrip embodiment, the small ferrite 55 could take the form of a surface mount device. Other forms of transmission line could also be used; the present invention is not limited to those shown or discussed. The frequency variable impedance could also take other forms than that of a ferrite.

The second above-noted improvement is accomplished by means of two factors. The first factor is a custom tool (not shown) available from Andrew Corporation, the assignee, used to drill the access hole in the tapped cable with one hand. The second factor, unique to this invention, is the use of the adhesive foam 17 as an attachment means and as a means of sealing the cable and tap against the ingress of moisture. The adhesive foam may be supplemented with cable ties on the ends of the tap housing 15, if is desired.

The third improvement is accomplished by using very flexible but low loss cable as the tap cable 25 between the tap and the connector. This cable 25 saves the cost to the user of a jumper cable and allows the use of the adhesive mounting method because of reduced stress to the adhesive.

The cost of the fabricated and assembled circuit board 32, the cost of the housing 15 and the installed cost of the tap 10 will be much lower than any tap on the market because of the ease of installation and the elimination of a purchased jumper wire.

This approach to the tap will have an overall improved performance for the cost. In one embodiment, some of the elements and components described above may be the following:

| Item | Qty | Mfgr P/N | Mfgr | Desc. | Comments |
|---|---|---|---|---|---|
| 25 |   | 9310 | Beiden | cable | Duobond II RG58/U |
| 50 | 1 | 3001-7341-10 | M/A-Com | N male connector | or equivalent |
| 70 | 1 | 83-10-M12818-1000 | Chomerics | ferrite, cable | clips around cable very near board |
| 55 | 1 | 2661000101 | Fair-Rite | ferrite, bead | 10 dB tap only |
| 30 | 1 | S-1-B-6.6-G D/C | Interconnect Devices | probe (spring pin) | 40 mil diameter, point is 11.5 mm below board |
| 32 | 1 | RO4003 | Rogers Corporation | circuit board | pattern tbd, 0.5" by 1.5" gnd plane and ckt |

The new tap is truly broadband, and has uniform insertion loss (thru) and coupling loss in the entire band.

The simplicity of manufacture will also enhance performance repeatability. The new tap is designed to be reliable and water resistant, a feature not found on most taps currently on the market.

The tap described above results in low losses and operates across a wide frequency band. It provides a broadband input impedance that allows it to be used in 30 to 150 ohm coaxial systems. The single hole used by the system is simple and economical to use. The tap also generates very low intermodulation products when nonlinear components are not used. The tap makes possible couplings from 3 dB to over 20 dB while maintaining the same or wider bandwidth. The tap presents minimum degradation of performance while maintaining uniform coupling over a broad bandwidth.

The tap assembly of the invention can be adapted to attach to coaxial cables of a variety of sizes. Furthermore, these assemblies are rugged, suitable for a wide range of applications, and do not require a splice. The assemblies are also easy and inexpensive to manufacture since they contain a minimum number of parts.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A tap system for coupling electromagnetic energy between a host coaxial cable and a second coaxial cable, said system comprising:
   an impedance transformer;
   a probe for connecting said impedance transformer to said host cable;
   a first frequency-variable impedance electrically in series between said probe and said impedance transformer;
   said first frequency variable impedance having a frequency variable inductance in a first frequency range, and being substantially resistive in a second frequency range above said first frequency range; and
   a tap cable for connecting said impedance transformer to said second cable.

2. The tap system of claim 1 wherein said impedance transformer comprises a transmission line.

3. The tap system of claim 1 wherein there is not a direct connection between ground shields of said host and tap cables.

4. The tap system of claim 3 wherein said impedance transformer, said first frequency-variable impedance, said tap cable and said probe are mounted to a circuit board so as to achieve an indirect connection between ground shields of the host and tap cables, via a board capacitance of said circuit board.

5. The tap system of claim 1 and further including a second frequency-variable impedance electrically in series with a ground shield of said tap cable, a first frequency-variable impedance electrically in series between said probe and said impedance transformer; said second frequency variable impedance having a frequency variable inductance in a first frequency range, and being substantially resistive in a second frequency range above said first frequency range.

6. The tap system of claim 5 wherein said first and second frequency-variable impedances comprise a first ferrite bead surrounding said probe, and a second ferrite bead surrounding said tap cable.

7. The tap system of claim 1 and further including an external housing and a quantity of adhesive foam in said housing for sealing said probe, and for attaching said housing, to said host cable.

8. The tap system of claim 1 and further including a coaxial cable connector coupled to a free end of said tap cable, said tap cable comprising a short length of flexible, low loss cable.

9. The tap system of claim 8 and further comprising an external housing, and wherein said short length of flexible low loss cable extends outwardly of said housing.

10. The tap system of claim 1 wherein said probe is spring loaded for positive engagement with a center conductor of said host cable.

11. A coaxial tap for coupling electromagnetic energy between first and second coaxial cables, said tap comprising:
   a probe extending through an outer conductor of the first cable into contact with an inner conductor of the first cable;
   an impedance transformer connecting the probe with an inner conductor of the second cable for coupling electromagnetic signals between the first and second cables; and a first frequency-variable impedance electrically in series between the probe and the impedance transformer;

said first frequency variable impedance having a frequency variable inductance in a first frequency range, and being substantially resistive in a second frequency range above said first frequency range.

12. The coaxial tap of claim 11 wherein said probe is spring-loaded to bias the probe into engagement with the inner conductor of the first cable.

13. The coaxial tap of claim 11 which includes an external housing, and a coaxial connector adapted to be connected to the second cable.

14. The coaxial tap of claim 13 which includes a tap cable coupled between the impedance transformer and the coaxial connector.

15. The coaxial tap of claim 14 wherein there is not a direct connection between ground shields of said first and tap cables.

16. The coaxial tap of claim 15 wherein said impedance transformer, said first frequency-variable impedance, said tap cable and said probe are mounted to a circuit board so as to achieve an indirect connection between ground shields of the first and tap cables, via a board capacitance of said circuit board.

17. The coaxial tap of claim 14 and further including a second frequency-variable impedance said first frequency variable impedance having a frequency variable inductance in a first frequency range, and being substantially resistive in a second frequency range above said first frequency range electrically coupled to a ground shield of said tap cable.

18. The coaxial tap of claim 17, wherein said first and second frequency-variable impedances comprise a first ferrite bead surrounding said probe, and a second ferrite bead surrounding said tap cable.

19. The coaxial tap of claim 14 and wherein said tap cable includes a short length of flexible, low loss cable extending outwardly of said housing and terminating in said coaxial connector.

20. The coaxial tap of claim 11 wherein said impedance transformer comprises a transmission line.

21. The coaxial tap of claim 11 which includes insulating and sealing means for insulating said probe from an outer conductor of the first cable and for sealing said probe to said first cable.

22. The coaxial tap of claim 21 and further including an external housing, and wherein said insulating and sealing means include a quantity of adhesive foam for sealing said probe, and said housing, to said host cable.

23. A method for extracting electromagnetic energy from a first cable and coupling said energy to a second cable comprising the steps of:

providing first and second cables with inner conductors;

drilling a hole into said first cable to extend to said inner conductor of said first cable;

extending a probe through the outer conductor of said first cable into contact with the said inner conductor of said first cable;

coupling the probe to the inner conductor of the second cable using an impedance transformer which couple electromagnetic signals between the first and second cables; and placing a first ferrite bead around said probe.

24. The method of claim 23 and further including connecting a tap cable between said impedance transformer and said second cable and placing a second ferrite bead around said tap cable.

25. A tap system for coupling electromagnetic energy between a host coaxial cable and a second coaxial cable, said system comprising:

an impedance transformer;

a probe for connecting said impedance transformer to said host cable;

a first ferrite bead surrounding said probe to provide a frequency-variable impedance in series between said probe and said impedance transformer;

said first frequency variable impedance having a frequency variable inductance in a first frequency range, and being substantially resistive in a second frequency range above said first frequency range; and a tap cable for connecting said impedance transformer to said second cable.

26. The tap system of claim 25 wherein and further including a second ferrite bead surrounding said tap cable to provide a frequency-variable impedance, said first frequency variable impedance having a frequency variable inductance in a first frequency range, and being substantially resistive in a second frequency range above said first frequency range in series with a shield of said tap cable.

* * * * *